United States Patent
Takanashi

(10) Patent No.: US 7,560,153 B2
(45) Date of Patent: Jul. 14, 2009

(54) INSERT-MOLDED ARTICLE AND A PRODUCTION METHOD FOR INSERT-MOLDED ARTICLE

(75) Inventor: Hitoshi Takanashi, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 649 days.

(21) Appl. No.: 11/103,833

(22) Filed: Apr. 11, 2005

(65) Prior Publication Data

US 2005/0227036 A1 Oct. 13, 2005

(30) Foreign Application Priority Data

Apr. 13, 2004 (JP) .............................. 2004-117838

(51) Int. Cl.
- *B32B 1/04* (2006.01)
- *H05K 5/06* (2006.01)
- *H01R 13/58* (2006.01)
- *H01R 13/405* (2006.01)

(52) U.S. Cl. ...................... 428/68; 428/172; 174/50.51; 174/521; 439/606; 439/736

(58) Field of Classification Search ................... 428/68, 428/99, 172, 192; 439/606, 686, 722, 736; 361/142, 600, 611, 648, 658, 679; 257/433; 174/50.51, 521

See application file for complete search history.

(56) References Cited

U.S. PATENT DOCUMENTS

| 5,964,622 | A | 10/1999 | Ishikawa et al. |
| 6,294,851 | B1 | 9/2001 | Matsuyama et al. |
| 2004/0002260 | A1 * | 1/2004 | Okamoto ..................... 439/606 |

FOREIGN PATENT DOCUMENTS

DE 195 04 828 A1 8/1996

* cited by examiner

*Primary Examiner*—Donald Loney
(74) *Attorney, Agent, or Firm*—Gerald E. Hespos; Anthony J. Casella

(57) ABSTRACT

A casing (10) is formed by insert molding using an inner portion (30) holding busbars (20) as an insert. The inner portion 30 includes an interlocking portion (33) to be hooked in a mold for molding the casing (10), and is so positioned and supported in the mold by the presence of the interlocking portion (33) as to project from the inner wall surface of the mold. The interlocking portion (33) is formed to project toward the inside of the casing (10) from the inner surface of the casing (10). The casing (10) is formed by covering the inner portion (30) excluding the interlocking portion (33) by a resin portion (13).

12 Claims, 6 Drawing Sheets

INSERT-MOLDED ARTICLE AND A PRODUCTION METHOD FOR INSERT-MOLDED ARTICLE

BACKGROUND OF THE INVENTION

1. Field of the Invention

The invention relates to an insert-molded article and a production method for insert-molded article.

2. Description of the Related Art

U.S. Pat. No. 5,964,622 discloses a technology of forming a primary molded article using an electrically conductive metallic member as an insert and then forming a secondary molded article using the primary molded article as an insert. According to this technology, a support is formed during the primary molding and is held in contact with the inner wall surface of the mold for the secondary molded article. Thus, the electrically conductive member in the primary molded article is positioned precisely in the secondary molded article.

In the above case, an end surface of the support of the primary molded article is exposed at the outer surface of the secondary molded article after the insert molding. Thus, there is a possibility that moisture may enter a tiny clearance created at an interface of the primary molded article and the secondary molded article from the periphery of the end surface of the support. For example, an ECU casing has a printed circuit board accommodated therein. A watertight casing has been difficult to attain due to the entry of water from the exposed end surface if the end surface is at the outer surface of the casing.

The invention was developed in view of the above problem and an object thereof is ensure watertight connector.

SUMMARY OF THE INVENTION

The invention relates to an insert-molded article with an insert-molded inner member that has at least a first insert. Thus, the first insert is supported and at least partly surrounded by a resin of the inserted-molded inner member. The insert-molded article further includes an insert-molded casing that has the inner member as an insert. Thus, the inner member is supported and at least partly surrounded by a resin of the insert-molded casing. The inner member includes at least one interlocking portion to engage a mold for molding the casing. The interlocking portion is on the inner surface of the casing, and the casing covers substantially the entire inner portion except the interlocking portion. Thus, an end surface of the interlocking portion is not exposed at the outer surface of the casing, and the entry of water from the outer surface of the casing is prevented, and watertightness is assured.

The interlocking portion preferably projects substantially towards the inside of the casing from the inner surface of the casing. Thus, insert molding can be carried out with the interlocking portion tightly held between opposed portions of the mold, thereby enabling the construction of the mold to be simplified.

The first insert may be at least one busbar that is electrically connectable with a conductor of a printed circuit board or an electrical or electronic component accommodated in the casing. Additionally, the interlocking portion may be made of a synthetic resin to help insulate the busbar and to prevent leakage.

One of the interlocking portion and the mold preferably comprises a recess and the other of the interlocking portion and the mold preferably comprises a projection that is engageable with the recess.

At least one recess may be formed at one or more corners of the inner portion. Most preferably, two substantially L-shaped recesses are formed at diagonally opposite corners of the inner portion.

The invention also relates to a production method for an insert-molded article. The method includes insert-molding an inner portion with at least a first insert supported and at least partly surrounded by a holding portion of the inner portion. The method also includes insert-molding a casing with the inner portion as the insert. The step of molding the casing includes hooking an interlocking portion of the inner portion in a mold for molding the casing, thereby positioning and supporting the inner portion in the mold to project from an inner wall surface of the mold, and carrying out insert molding in this state.

The hooking step preferably includes engaging a recess at one of the interlocking portion and the mold with a projection provided at the other of the interlocking portion and the mold.

The step of insert-molding the casing preferably includes holding the interlocking portion tightly between a first mold member and second mold member so that parts of the inner portion project in a cavity that receives a molding material.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
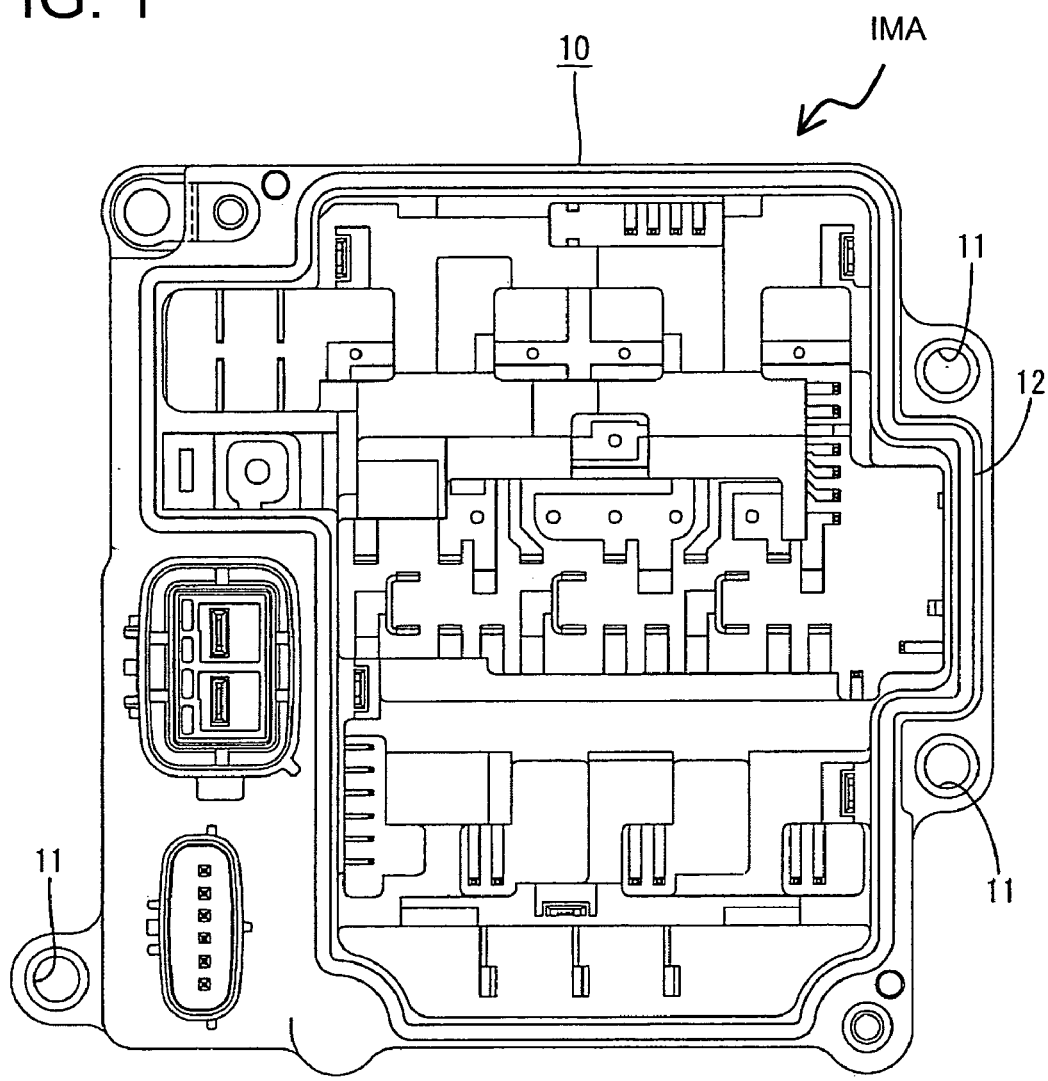
FIG. 1 is a plan view of an ECU casing according to one embodiment of the invention.
Figure 2:
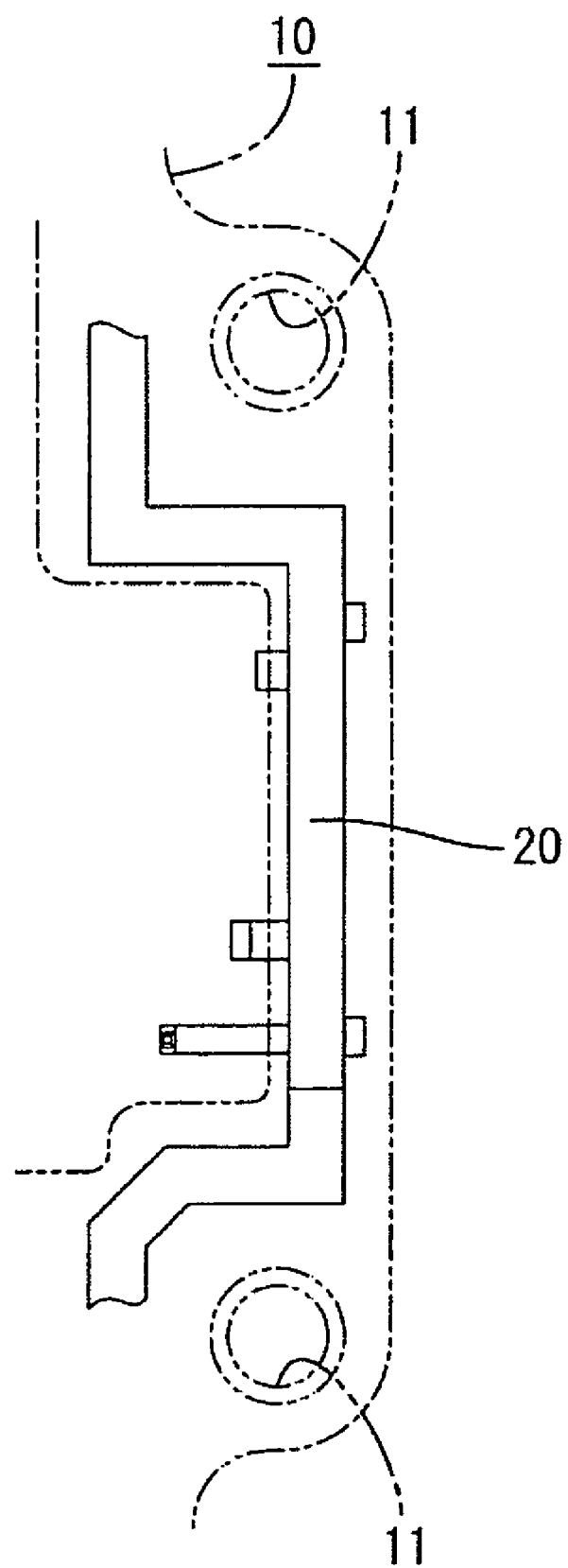
FIG. 2 is an enlarged plan view showing an essential portion of an embedded state of a busbar.

An insert-molded article IMA according to the invention is illustrated in FIGS. 1 to 6, and preferably is an electronic control unit (ECU) having a printed circuit board accommodated inside a casing 10. The casing 10 is made e.g. of a synthetic resin and defines a box having an open upper surface. The printed circuit board and a plurality of busbars are arranged in the casing 10.

An unillustrated cover is mounted on an opening of the casing 10 to ensure watertightness in the casing 10. Mount holes 11 are formed on the outer periphery of the casing 10, and bolts are inserted through the mount holes 11 to mount the casing 10 on a body of a vehicle.

The casing 10 has sidewalls 12 and strip-shaped busbars 20 are embedded at specified parts of sidewalls 12 along the wall surfaces of the sidewalls 12. The busbar 20 is embedded at least partly in a bulge of the lateral sidewall 12, shown in FIG. 1, and is crank-shaped so that the ends project into the casing 10 for connection with the printed circuit board and electric or electronic components. The busbars 20 is an insert of an inner portion 30 and the inner portion 30 is used as an insert for the casing 10.

Figure 3:
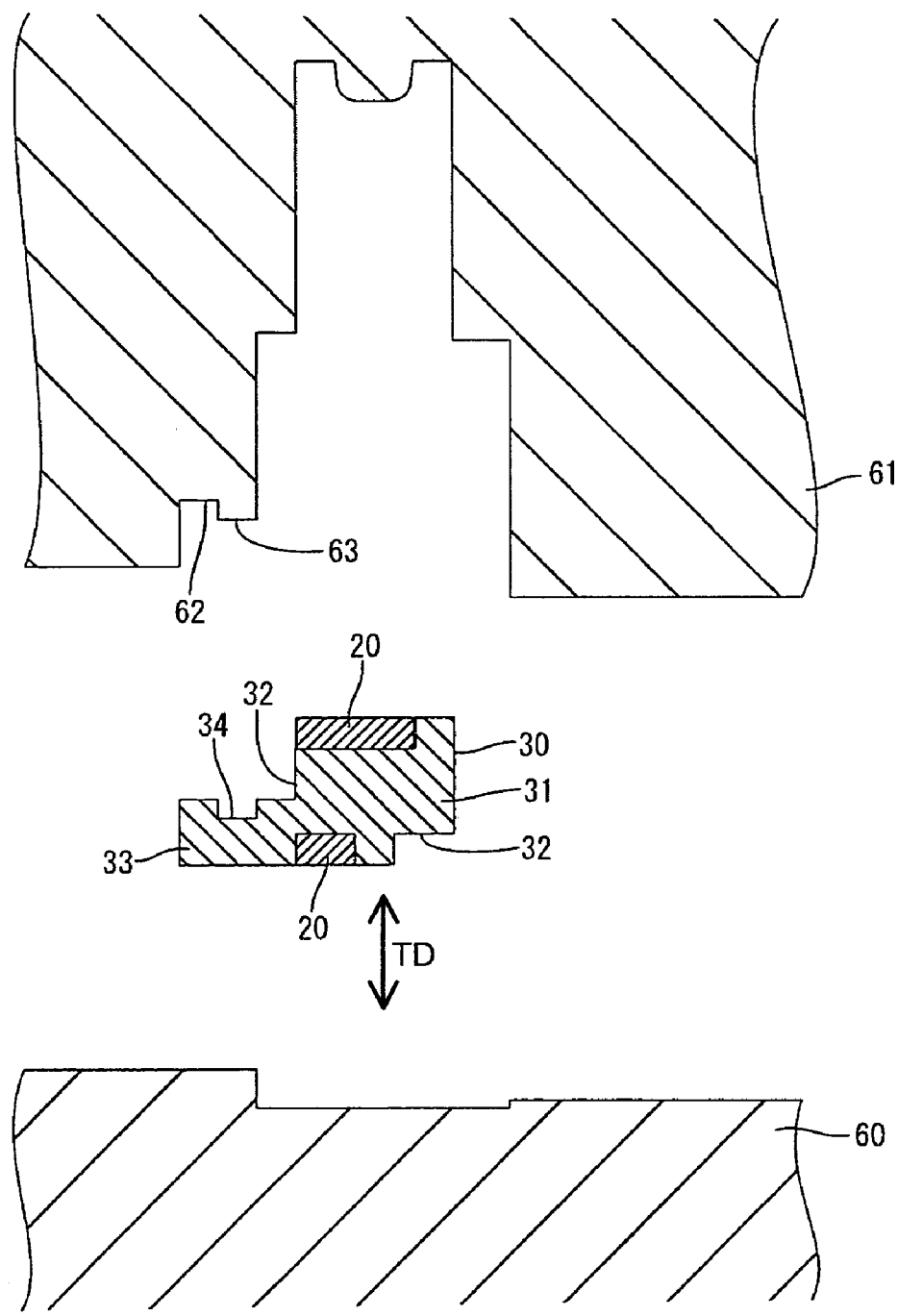
FIG. 3 is a section showing a state before an inner portion is set in a mold.

The inner portion 30, as shown in FIG. 3, has two busbars 20 spaced apart by a specified distance along a thickness direction TD, which is substantially normal to the longitudinal direction of the busbars 20. The inner portion 30 also has a holding portion 31 made e.g. of a synthetic resin for covering the facing surfaces of the respective busbars 20. Thus, the holding portion 31 holds the busbars 20 at a specified spacing. Recesses 32 of substantially L-shaped cross sections are formed at substantially diagonally opposite corners of the holding portion 31, shown in FIG. 3. A resin portion 13 (to be described later) of the casing 10 at least partly enters these recesses 32 to enhance an engaging force with the resin portion 13, so that the inner portion 30 does not come out of the casing 10.

An interlocking portion 33 extends unitarily from the holding portion 31 at the lateral side of the busbar 20 disposed at the lower left in FIG. 3. The interlocking portion 33 projects substantially horizontally from its base end toward its leading end, and can be hooked in a mold 61 for secondary molding. More particularly, the interlocking portion 33 engages the mold 61 so that the inner portion 30 is positioned and supported to project in from the inner surface of the mold 61. A recess 34 is formed in a surface of the interlocking portion 33 so that the interlocking portion 33 has a substantially U-shaped cross section. The recess 34 closely engages a projection 63 in the mold 61 to prevent the inner portion 30 from making loose lateral movements in the mold 61.

The casing 10 is formed by insert molding, and the inner portion 30 is the insert for this insert molding process. Thus, substantially the entire inner portion 30 except the interlocking portion 33 is surrounded and supported by a unitary matrix of resin 13 that defines the casing 10. The resin 13 of the casing 10 and the resin of the holding portion 31 preferably are the same. The interlocking portion 33 is at the inner surface of the casing 10 and projects towards the inside of the casing 10 from the inner surface of the casing 10 with the recess 34 as a border.

The mold for secondary molding includes a lower mold 60 and an upper mold 61, as shown in FIG. 3. The upper mold 61 has a receiving portion 62 recessed substantially in conformity with the shape of the interlocking portion 33, and the projection 63 projects down adjacent the inner wall surface of the receiving portion 62. The interlocking portion 33 is engageable with the receiving portion 62 as the mold 61, 62 is closed. Thus, the interlocking portion 33 is held tightly between the upper mold 61 and the lower mold 60 and projects in a cavity 66.

Figure 4:
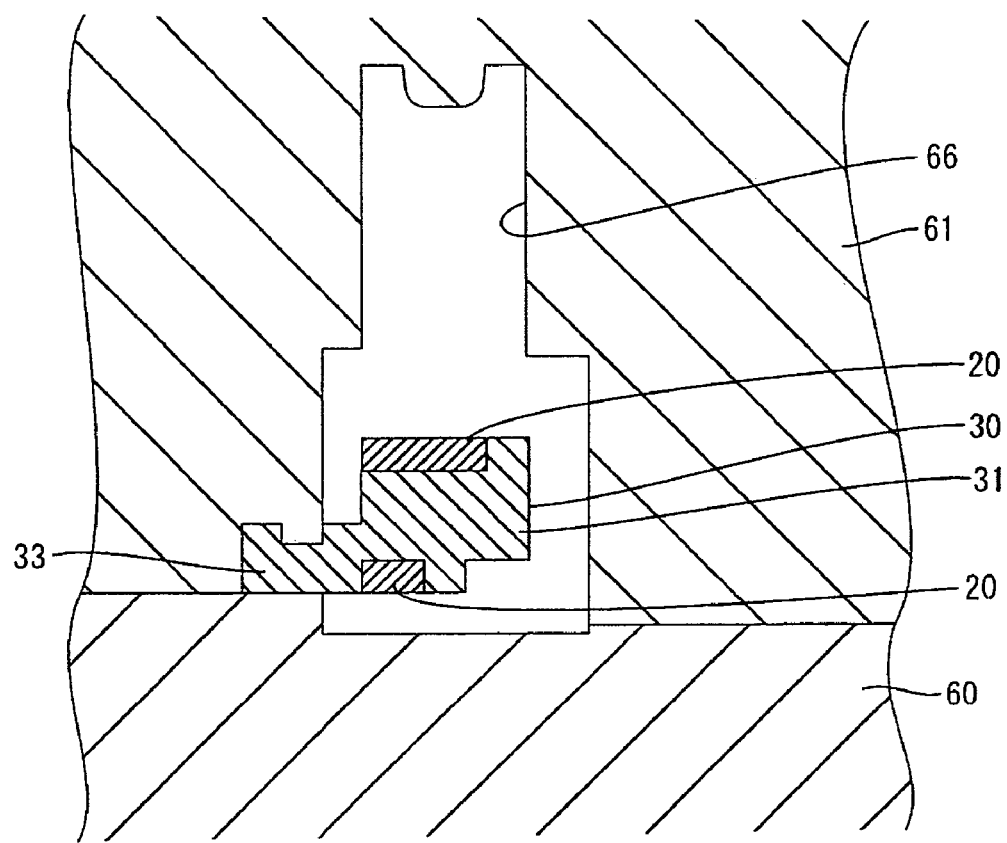
FIG. 4 is a section showing a state where the inner portion is set in the mold.
Figure 5:
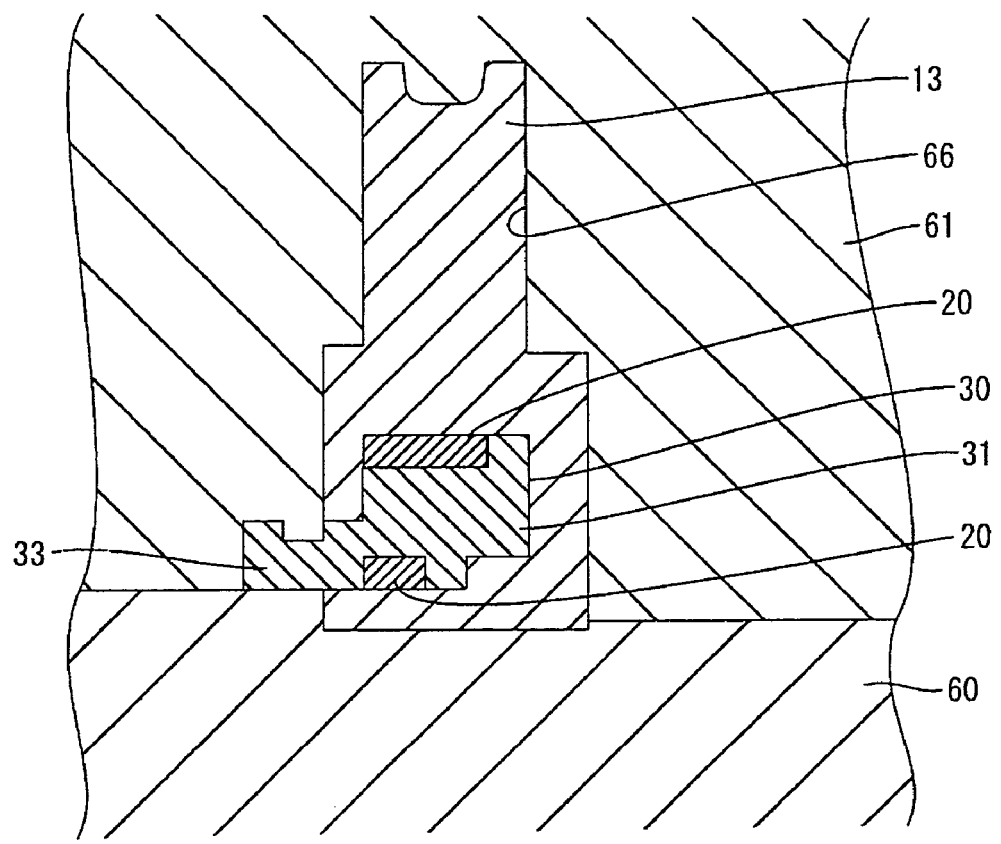
FIG. 5 is a section showing a state where molten resin is filled into a cavity.
Figure 6:
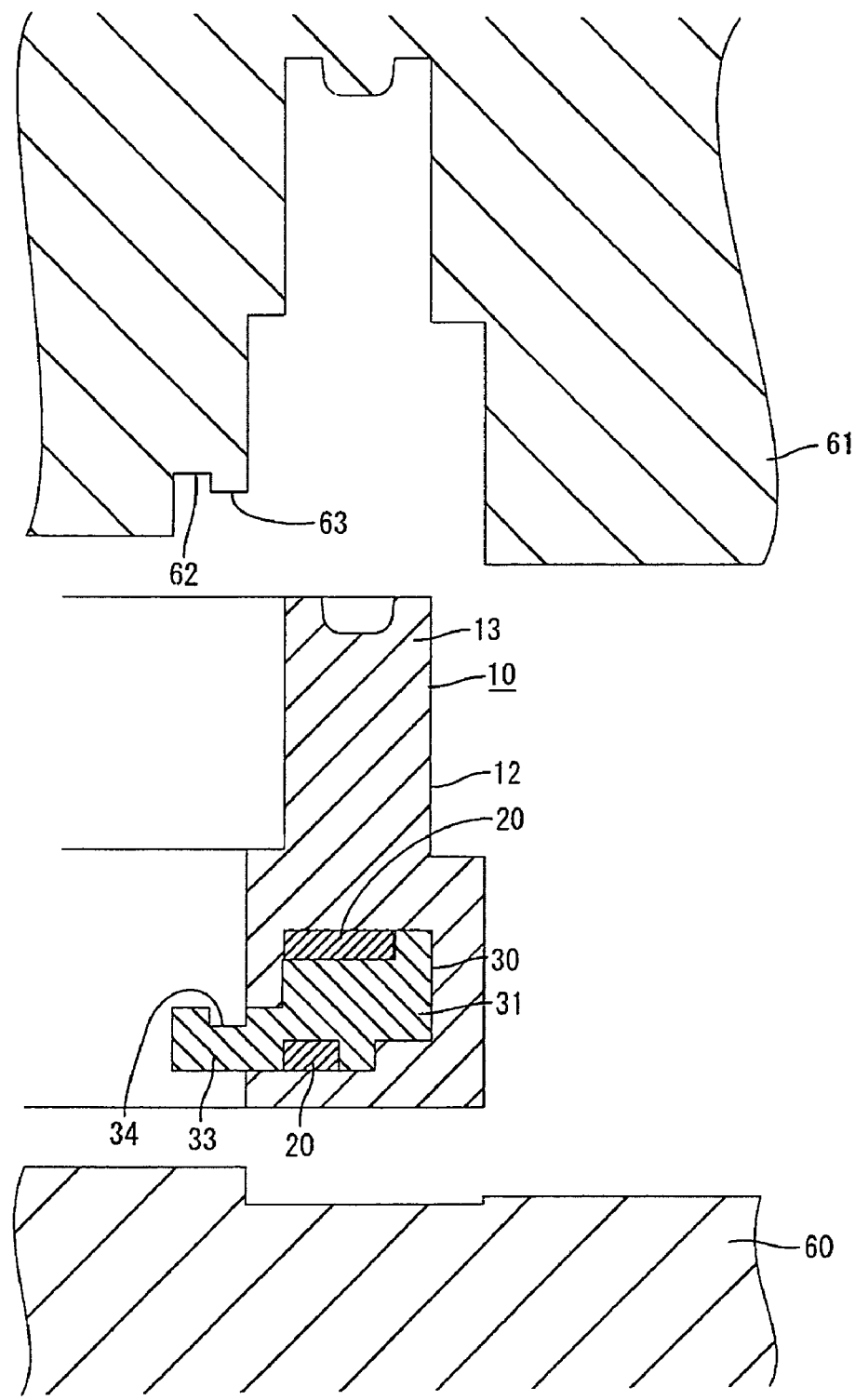
FIG. 6 is a section showing a state where the mold is opened to enable the inner portion to be taken out.

The casing 10 is formed by two sequential insert molding processes. First, the inner portion 30 is formed by an insert molding process that uses the busbars 20 as inserts. Thus, the busbars 20 are supported and partly surrounded by a unitary matrix of resin. The casing 10 then is formed by an insert molding process that uses the inner portion 30 as the insert. More particularly, the lower and upper molds 60, 61 are closed around the inner portion 30, as shown in FIGS. 3 and 4. Thus, the projecting end of the interlocking portion 33 fits in the receiving portion 62 and the projection 63 of the upper mold 61 engages the recess 34 of the interlocking portion 33. Accordingly, the interlocking portion 33 is held tightly between the upper and lower molds 61, 60. Additionally, the inner portion 30 is positioned precisely to project from the inner wall surface of the mold and is prevented from making loose lateral or vertical movements. Molten resin then is injected into the cavity 66 of the mold. The mold is opened after the molten resin has cooled and solidified. As shown in FIG. 6, the interlocking portion 33 is exposed at the inner surface of the casing 10, and a unitary matrix of the resin 13 of the casing 10 surrounds, supports and positions the holding portion 31.

As described above, the interlocking portion 33 is interlocked with the mold to position and support the inner portion 30 so that the holding portion 31 projects from the inner wall surface of the mold. The casing then is formed by an insert molding process that uses the inner portion 30 as an insert. Thus, substantially the entire inner portion 30, excluding the interlocking portion 33, is surrounded, supported and positioned by a unitary matrix of the resin 13. The interlocking portion 33 is at the inner surface of the casing 10. Thus, an end surface of the interlocking portion 33 is not exposed at the outer surface of the casing 10, and the entrance of water from the outside of the casing 10 can be securely prevented. As a result, watertightness in the casing 10 can be maintained and leakage can be prevented.

Further, the interlocking portion 33 projects towards the inside of the casing 10 from the inner surface of the casing 10. Thus, insert molding can be carried out with the interlocking portion 33 tightly held between the upper and lower molds 61, 60. Therefore, the construction of the mold can be simplified.

The invention is not limited to the above described and illustrated embodiment. For example, the following embodiments are also embraced by the technical scope of the present invention as defined by the claims. Beside the following embodiments, various changes can be made without departing from the scope and spirit of the present invention as defined by the claims.

Although the inner portion is formed by insert molding using the one or more busbars as inserts in the foregoing embodiment, the inner portion may be comprised of one or more busbars and a cover capable of holding the busbar(s) without being insert-molded according to the present invention.

Although the interlocking portion projects towards the inside of the casing in the foregoing embodiment, it is sufficient for the interlocking portion to be located at the inner surface of the casing so as to be hookable or interlockable in the mold. For example, the interlocking portion may be formed to retract into the sidewall of the casing.

Although the interlocking portion is made of the synthetic resin in the foregoing embodiment, it may be formed by a part of the busbar according to the present invention. Then, the busbar and a conductor arranged in the casing can be connected electrically by causing the busbar as the interlocking portion to project toward the inside of the casing.

The inner portion holds the busbars in the foregoing embodiment. However, the inner portion may hold members other than the busbars.

Although in the above embodiment only one interlocking portion 33 is provided, it should be understood that two or more interlocking portions may be provided for correctly positioning the inner portion during the molding process.

What is claimed is:

1. An insert-molded article comprising:
   an inner portion formed by insert molding and having at least one insert member is partly surrounded and supported by a unitary resin holder, the holder including at least one interlocking portion, a part of the inner portion spaced from the interlocking portion having at least one recess in an outer surface thereof; and
   a casing formed by insert molding with the inner portion defining an insert therein, the casing including a unitary matrix of resin covering portion of the insert member that are not surrounded by the resin of the holder, the resin of the casing further covering substantially all of the holder except the interlocking portion and the interlocking portion being located at an inner surface of the casing.

2. The insert-molded article of claim 1, wherein the interlocking portion projects towards the inside of the casing from the inner surface of the casing.

3. The insert-molded article of claim 1, wherein the insert member includes a busbar electrically connectable with a conductor portion of a component in the casing.

4. The insert-molded article of claim 1, wherein the interlocking portion is made of a synthetic resin.

5. The insert-molded article of claim 1, wherein the interlocking portion comprises a recess.

6. The insert-molded article of claim 1, wherein two recesses are formed at substantially diagonally opposite corners of the inner portion.

7. An insert-molded article for electrical or electronic components, comprising:
    at least one busbar;
    a holding portion defining a unitary matrix of a first resin partly surrounding and supporting the busbar, the holding portion having at least one recess formed therein;
    an interlocking portion projecting from the holding portion, the interlocking portion being unitary with the holding portion; and
    a casing defining a unitary matrix of a second resin covering portion of the busbar that are not surrounded by the holding portion, the unitary matrix of the second resin at least partly surrounding, supporting and positioning the holding portion so that the interlocking portion faces into an interior of the casing, the second resin being in the recess of the holding portion for positioning the holding portion and the busbar in the casing.

8. The insert-molded article of claim 7, wherein the interlocking portion has a recess formed therein.

9. The insert-molded article of claim 7, wherein the first and second resins are the same.

10. An insert-molded article (IMA) for electrical or electronic components, comprising:
    at least one busbar having a plurality of external surfaces;
    a holder defining a unitary matrix of a first resin, the unitary matrix of the first resin partly surrounding the busbar so that at least one of the external surfaces of the busbar is exposed outwardly from the holder, the unitary matrix of the first resin including an interlocking projection spaced from the busbar, the holder having at least one recess; and
    a casing defining a unitary matrix of a second resin surrounding the at least one surface of the busbar facing outwardly from the holder and surrounding, supporting and positioning portions of the holder spaced from the interlocking projection, the casing having an interior and the interlocking portion projecting into the interior of the casing, the second resin being in the recess of the holder for positioning the holder and the busbar in the casing.

11. The insert-molded article (IMA) of claim 10, wherein the interlocking portion has a recess formed therein.

12. The insert-molded article of claim 10, wherein the first and second resins are the same.

* * * * *